United States Patent [19]

Herberg

[11] Patent Number: 4,811,074
[45] Date of Patent: Mar. 7, 1989

[54] DARLINGTON CIRCUIT COMPRISING A FIELD EFFECT TRANSISTOR AND A BIPOLAR OUTPUT TRANSISTOR

[75] Inventor: Helmut Herberg, Munich, Fed. Rep. of Germany

[73] Assignee: Siemens Aktiengesellschaft, Berlin and Munich, Fed. Rep. of Germany

[21] Appl. No.: 228,866

[22] Filed: Aug. 5, 1988

Related U.S. Application Data

[63] Continuation of Ser. No. 770,888, Aug. 30, 1985, abandoned.

[30] Foreign Application Priority Data

Sep. 27, 1984 [DE] Fed. Rep. of Germany ....... 3435547

[51] Int. Cl.$^4$ ............................................. H01L 27/02
[52] U.S. Cl. ..................................... 357/96; 357/23.4; 357/43
[58] Field of Search ..................... 357/46, 43, 23.4, 38

[56] References Cited

U.S. PATENT DOCUMENTS

| 4,164,747 | 8/1979 | Gerstner ................................ 357/46 |
| 4,543,596 | 9/1985 | Strack et al. ....................... 357/23.4 |
| 4,584,593 | 4/1986 | Tihanyi ............................... 357/23.4 |
| 4,604,535 | 8/1986 | Sasayama et al. ................ 357/43 X |

FOREIGN PATENT DOCUMENTS

| 57-21853 | 2/1982 | Japan ..................................... 357/46 |
| 58-82562 | 5/1983 | Japan ..................................... 357/46 |
| 58-165374 | 9/1983 | Japan ..................................... 357/46 |

OTHER PUBLICATIONS

Leturcq, "Power Bipolar Devices", Microelectron. Reliab., vol. 24, No. 2, 1984, pp. 313–337.

Primary Examiner—Andrew J. James
Assistant Examiner—Sara W. Crane
Attorney, Agent, or Firm—Hill, Van Santen, Steadman & Simpson

[57] ABSTRACT

A Darlington circuit comprises a field effect transistor and a bipolar transistor monolithically integrated on a semiconductor body of a first conductivity type. In order to reduce the residual voltage which drops off between the emitter and the collector of the output transistor in the current-conducting condition, the emitter of the output transistor is composed of a plurality of emitter regions of the first conductivity type which are located in a plurality of island-shaped semiconductor regions of the second conductivity type, which thus serves as base regions for the output transistor. The lateral spacing between an emitter region and a source region of the field effect transistor provided in one and the same island-shaped semiconductor region is selected smaller than the thickness of the semiconductor body between its principle surfaces which are provided with contacts for the emitter terminal and the collector terminal.

8 Claims, 2 Drawing Sheets

1

DARLINGTON CIRCUIT COMPRISING A FIELD EFFECT TRANSISTOR AND A BIPOLAR OUTPUT TRANSISTOR

This is a continuation of application Ser. No. 770,888 filed Aug. 30, 1985, now abandoned.

BACKGROUND OF THE INVENTION

1. Field of the Invention

The present invention relates to a Darlington circuit comprising a field effect transistor and a bipolar output transistor which are integrated on a semiconductor body of a first conductivity type. The integration of the field effect transistor is undertaken in such a manner that an island-shaped semiconductor region of a second conductivity type is located in the semiconductor body, that a source region of the first conductivity type is located in the island-shaped semiconductor region and that the island-shaped semiconductor region comprises an edge zone extending up to a first principle surface of the semiconductor body and up to the edge of the source region, the edge zone being covered by a gate electrode. As a result, the source region is connected to the base of the output transistor and the emitter of the output transistor is provided with an emitter terminal, and the semiconductor body is provided with a collector terminal which simultaneously forms the drain terminal of the field effect transistor.

2. Description of the Prior Art

A circuit arrangement of the type set forth above is disclosed, for example, in the article "Power Bipolar Devices", by Ph. Leturcq in the periodical "Microelectronic" Reliab., Vol. 24, No. 2, 1982, pp. 313–337, particularly with respect to FIG. 18 on Page 335. In addition to an island-shaped semiconductor region accepting the source region of the field effect transistor, a further such region of the second conductivity type is provided into which an emitter region of the output transistor is embedded, this being connected via an emitter contact to the emitter terminal. The thickness of the semiconductor body is thereby selected smaller than the lateral distance of the drain region of the field effect transistor from the emitter region of the output transistor, whereby the drain region is formed by a sub-region of the semiconductor body which is immediately adjacent to the edge zone of the island-shaped region covered by the gate electrode.

SUMMARY OF THE INVENTION

The object of the present invention is to provide a Darlington circuit of the type generally set forth above wherein, given conditions which are otherwise identical, a significantly lower residual voltage is present between the emitter terminal and the collector terminal in the current-carrying condition than in the aforementioned known Darlington circuit.

The above object is achieved, in a Darlington circuit of the type generally set forth above, and which is particularly characterized in that the emitter region of the output transistor comprises a plurality of emitter regions of the first conductivity type which are provided with emitter contacts located on the first principle surface and connected to the emitter terminal, in that a plurality of island-shaped semiconductor regions are provided each containing at least one source region of the field effect transistor and one emitter region of the output transistor so that it additionally forms one of a plurality of base regions of the output transistor in that the source regions of an island-shaped semiconductor region are provided with electrically conductive coatings which contact the latter, in that each island-shaped semiconductor region comprises a plurality of edge zones corresponding to the plurality of source regions contained in the island-shaped semiconductor region, these edge regions being covered by gate electrodes electrically insulated from the first principle surface, in that the gate electrodes are connected to a common gate terminal, and in that the lateral spacing between an emitter region and a source region within an island-shaped semiconductor region is smaller than the thickness of the semiconductor body between the first principle surface and a second principle surface on which a collector contact is provided and connected to a collector terminal.

A particular advantage attained in practicing the present invention is that the drain regions of the field effect transistor which are composed of sub-regions of the semiconductor body and which are immediately adjacent to the edge zones of the island-shaped regions covered by the gate electrodes have a considerably higher conductivity than is the case in the above-mentioned known circuit. The cause of this is to be seen in that, in the current-carrying condition of the Darlington circuit, storage charges occur under the emitter regions of the output transistor operated in saturation or quasi-saturation, the storage charges extending into the drain regions. Given conditions which are otherwise identical, therefore, particularly given the feed of a base current of the same magnitude, the residual voltage dropping off between the emitter terminal and the collector terminal is reduced. For a comparable residual voltage, on the other hand, a significantly higher base current derives and, therefore, a higher maximum collector current to be output to a load circuit connected between the emitter terminal and the collector terminal ten occurs in the known Darlington circuit.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
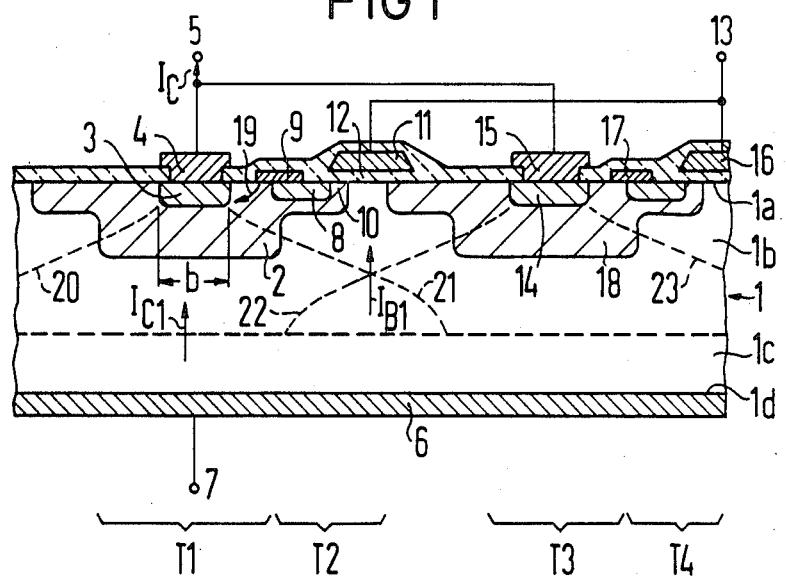
FIG. 1 is a fragmentary sectional view of a first exemplary embodiment of a Darlington circuit constructed in accordance with the present invention.

FIG. 1 illustrates a portion of a wafer-shaped body of a doped semiconductor material, for example silicon, in a fragmentary, cross-sectional view. The body comprises an n$^-$ layer 1b which extends up to a first principle surface 1a and an n$^+$ doped layer 1c lying therebelow which is limited by a second principle surface 1d of the semiconductor body. The following doping concentrations that can be proved advantageous, for example, for the layers 1b and 1c: $n_{1b} = 10^{14}$cm$^{-3}$, $n_{1c}=2.10^{18}$cm$^{-3}$. A portion of the layers 1b and 1c forms the collector of a bipolar npn transistor T1 whose base is composed of a p-conductive, island-shaped semiconductor region 2 which is located in the semiconductor body 1 such that it extends up to the principle surface 1a. An n-conductive emitter region 3 is located in the region 2, this being provided at the principle surface 1a with an emitter contact 4 which is connected to an emitter terminal 5. The doping concentration of the emitter region 3 at the principle surface 1a can amount to about $5.10^{20}$cm$^{-3}$, whereby the doping concentration of the semiconductor region 2 at the boundary to the emitter region 3 amounts, for example to $10^{17}$cm$^{-3}$. The layer 1c is provided at the second principle surface 1b with a collector contact 6 which is connected to a collector terminal 7.

The n-conductive source region 8 of an n-channel field effect transistor T2 is located in the island-shaped semiconductor region 2 and extends up to the principle surface 1a and is provided with a conductive coating 9 which is extended such in the direction towards the emitter region 3 that it projects beyond the lateral limitation of the region 8 and contacts the region 2. An edge zone 10 of the island-shaped region 2 which extends up to the principle surface 1a and up to the right-hand edge of the source region 8 is covered by a gate electrode 11 which is separated from the principle surface 1a by a thin, electrically insulating layer 12 and which is connected to a gate terminal 13. The drain region of the transistor T2 is formed by the sub-region of the layer 1b adjacent at the right-hand side of the edge zone 10 and by a corresponding sub-region of the layer 1c which lies therebelow. The collector terminal 7 simultaneously represents the drain terminal of the transistor T2. The source region 8 is, in turn, connected by way of the conductive coating 9 to the base 2 of the bipolar transistor T1.

In addition to the transistor combination T1, T2 heretofore described, the semiconductor body 1 also contains n-1 further, identically-constructed transistor combinations of which one is indicated at T3, T4. The emitter region 14 of the bipolar transistor T3 is thereby provided with an emitter contact 15 which is connected to the emitter terminal 5. The gate 16 of the field effect transistor T4 is connected to the gate terminal 13, whereas the collector of the transistor T3 and the drain region of the transistor T4 are connected to the terminal 7. The source region of transistor T4 is connected by way of a conductive coating 17 to the base of the transistor T3, this base being composed of an island-shaped region 18. The other transistor combinations (not shown) are disposed to the left and to the right of the transistors T1, T2 and T3, T4 on further portions of the semiconductor body 1 and are connected in an analogous manner to the terminals 5, 7 and 13. The totality of the field effect transistors T2, T4 . . . T2n thereby form the driver transistor and the totality of the bipolar transistors T1, T3 . . . T(2n-1) form the output transistor of a Darlington circuit. The emitter regions 3, 14, etc., of all transistor combinations represent the emitter of the output transistor; the island-shaped semiconductor regions 2, 18, etc, of all transistor combinations represent the base of the output transistor; the totality of the source regions 8, etc, of the transistors T2, T4, . . . T2n represent the source region of the driver transistor; the layers 1b and 1c represent a collector layer shared by the transistors T1, T3 . . . T(2n-1) and simultaneously represent a drain region shared by the transistors T2,T4 . . . T2n.

The lateral spacing between an emitter region, for example the region 3, and a source region, for example the source region 8, provided with the former in one and the same island-shaped semiconductor regions, for example the region 2, is selected smaller than the thickness of the semiconductor body 1 between the two principle surfaces 1a and 1d which, for example, amounts to 50–100 $\mu$m. The length of the n-channel of a field effect transistor, for example the transistor T2, which is defined by the width of the edge zone, for example the zone 10, adjacent to the source region, for example the region 8, advantageously has a value of roughly 0.5–1 $\mu$m. The lateral spacing between two island-shaped regions lying next to one another, for example the regions 2 and 18, corresponds roughly to the width of a source region, for example the region 8, and amounts, for example, to 10–50 $\mu$m.

When one proceeds from the non-conductive condition of the Darlington circuit in which a high voltage of, for example 1000 V is effective between the terminals 5 and 7, whereby the terminal lies at a more positive potential than the terminal 5 which is connected to a reference potential, and a positive potential of, for example, 20 V is applied to the common gate terminal 13, then an inversion layer is formed in the edge zone 10 below the gate electrode 11 at the principle surface 1a, the inversion layer representing a conductive channel between the source region 8 and the drain region 1b, 1c. A current $I_{B1}$ flows by way of the terminal 7 to the source region 8 and, from the source region 8, via the conductive coating 9, to the base region 2 of the transistor T1. As a consequence, a collector current $I_{C1}$ arises in the transistor T1 and flows from the terminal 7 to the emitter region 3 and, via the emitter region 3, to the emitter terminal 5. As a result of the current $I_{B1}$, which represents the base current of the transistor T1, positive charge carriers proceed roughly in the direction of an arrow 19 from the region 2 to the pn junction between the regions 2 and 3, the consequence being that negative charge carriers from the emitter region 3 are injected into the region 2. Together with further positive charge carriers flooded into the region 2 by way of the current $I_{B1}$, these form so-called storage charges which are at first built up below the region 3 in the region 2 and, given a lasting current $I_{B1}$, finally extend to the layer $1_B$. The lateral boundaries of the storage charge below the region 3 are indicated by the broken lines 20 and 21. Given the appearance of the storage charge, an expansion of the actual base zone of the transistor T1 occurs both in the vertical direction and in the lateral direction, whereby the conductivity within the expanded base zone 20, 21 is significantly greater than would correspond to the basis doping of the layer 1b.

The following relationship holds true for the residual voltage $U_{CE}$ appearing between the terminals 5 and 7 in the current-conducting condition of the transistor combination T1, T2:

$$U_{CE} = U_{BE} + \frac{R_{on} \cdot I_{Cl}}{\beta}. \qquad (1)$$

In the above relationship $U_{BE}$ denotes the positive bias voltage at the pn junction between the regions 2 and 3, $R_{on}$ denotes the forward DC resistance of the transistor T2, i.e. the resistance of the elements 8, 1b and $1c$ as well as that of the inversion channel in the region 10 permeated by the base current $I_{B1}$, and $\beta$ denotes the short circuit forward current transfer ratio of the transistor T1.

Due to the appearance of the storage charge 20, 21, $R_{on}$ is reduced, this meaning a reduction of the voltage $U_{CE}$ given a constant collector current $I_{C1}$. When, on the other hand, the voltage $U_{CE}$ is held constant, then due to the storage charge, the base current $I_{B1}$ increases, which results in a corresponding increase of the collector current $I_{C1}$ of the transistor T1.

Analogous events also sequence in the remaining transistor combinations T3, T4 . . . T(2n-1) T2n, given the connection of a gate voltage of, for example 20 V at the terminal 13. A reduction of the forward DC resistance $R_{on}$ thereby occurs in the individual transistors T2, T4 . . . T2n due to the storage charges of the transistor T1, T3 . . . T(2n-1), the consequence being that, when the collector current $I_C$ of the Darlington circuit is held constant, the residual voltage between the terminals 5 and 7 assumes a smaller value than is the case given the traditional circuit of this type. On the other hand, given a constant residual voltage between the terminals 5 and 7, the maximum collector current $I_C$ of the Darlington circuit is increased in comparison to traditional circuits.

These effects can be further intensified in that, for respectively two transistor combinations lying side-by-side, for example T1, T2 and T3, T4, the forward DC resistance $R_{on}$ of the one field effect transistor, for example the transistor T2, is reduced not only due to the storage charge of the appertaining bipolar transistor, for example the transistor T1, but is also reduced due to the storage charge, for example at 22, 23, of the bipolar transistor, for example the transistor T3, assigned to the adjacent transistor combination, for example the transistors T3, T4. This occurs when the appertaining storage charges according to FIG. 1 mutually overlap. In order to achieve an overlap, it is advantageous to select the lateral spacing between the emitter regions, for example the regions 3 and 14, of two mutually adjacent bipolar transistors, for example the transistors T1 and T3, such that it corresponds to roughly twice the lateral spacing between the emitter region of one of the bipolar transistors for example the transistor T1, and the drain region of the field effect transistor for example the transistor T2, assigned thereto.

Figure 2:
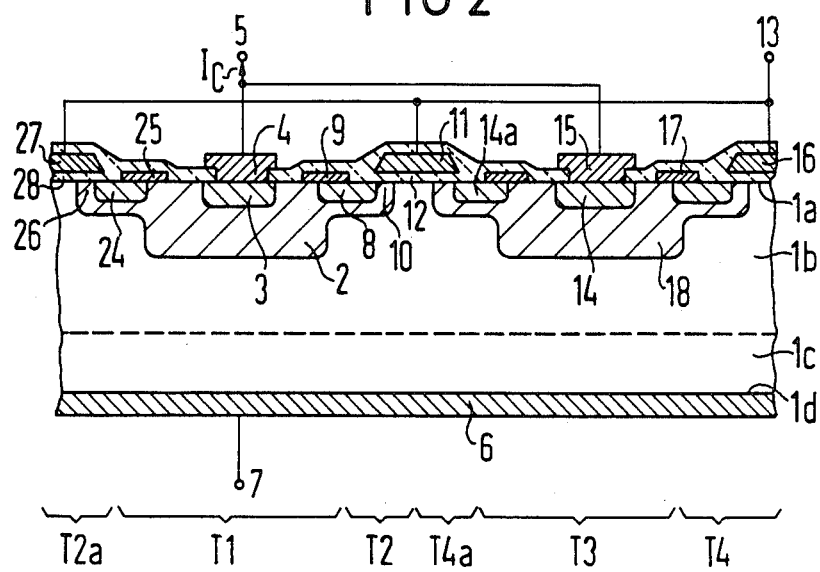
FIG. 2 is a fragmentary sectional view of a second exemplary embodiment of a Darlington circuit constructed in accordance with the present invention.

FIG. 2 illustrates an exemplary embodiment of the invention wherein the island-shaped semiconductor region, in addition to containing the emitter region of the output transistor and the already-described source region 8 of the transistor T2, contains a further source region 24 which is provided with a conductive coating 25 which is extended such, in the direction towards the region 3, that it projects beyond the pn junction between the regions 24 and 2 and contacts the region 2. An edge zone 26 of the region 2 which extends up to the principle surface $1a$ and up to the left-hand edge of the source region 24 is covered by a gate electrode 27 which is separated from the principle surface $1a$ by a thin, electrical insulating layer 28. The gate electrode 27 together with a heretofore described gate electrodes 11 and 16, is connected to the common gate terminal 13. In FIG. 2, the parts already described are provided with the same reference characters as in FIG. 1. The field effect transistor T2a formed of the elements 24, 26, $1b$, $1c$, 27, 28 and 25, just like the field effect transistors T2, serves for the drive of the transistor T1. In a corresponding manner, a further field effect transistor T4a is disposed at the left-hand edge of the island-shaped semiconductor region 18 by way of which the transistor T3 is driven. Advantageously, the gate electrode 11 is shared by the transistors T2 and T4a. The other transistor combinations also respectively comprise an additional field effect transistor.

Given this exemplary embodiment of the invention, a higher switchable collector current $I_C$ occurs than in the circuit of FIG. 1, since the storage charges below the emitter regions, for example the region 3, of the output transistor respectively reduce the forward DC resistances $R_{on}$ of both field effect transistors, for example the transistors T2 and T2a which are disposed at the edges of the appertaining island-shaped semiconductor region, for example the region 2.

The dimensioning requirements explained with respect to FIG. 1 for the lateral spacing of the source region of the field effect transistor from the emitter region of the appertaining output transistor, as well as for the lateral spacing of the island-shaped semiconductor regions from one another are also valid for the structure of FIG. 2.

According to a preferred embodiment of the invention the width b of one of the emitter regions of the output transistor, for example the region 3, measured in the direction towards the adjacent emitter region, for example the region 14, of this transistor is selected smaller than the lateral spacing between these regions. In FIG. 1, the distance b amounts to about ¼ of this spacing. Particularly given high-voltage transistors, such a great fanning of the collector current paths of the transistors T1, T3 . . . T(2n-1) occurs in the lateral direction that, for n transistor combinations, a reduction of the principle surface of the semiconductor body 1 deriving from the reduction of the distance b can be exploited without a noticeable reduction of the maximally-permissible collector current $I_C$ having to be accepted. In particular, the width b can be advantageously selected by about one order of magnitude smaller than the lateral spacing without a significant reduction of the maximally-permitted collector current $I_C$. Given a spacing of, for example, 100 $\mu$m, the width b can be reduced, for example, to 10 $\mu$m. In traditional Darlington circuits, the width of an emitter of the output transistor amounts to 100-200 $\mu$m in comparison thereto. The width of the source regions, for example the region 8, of the driver transistor is matched to the width of the emitter regions of the output transistor in an advantageous manner.

Figure 3:
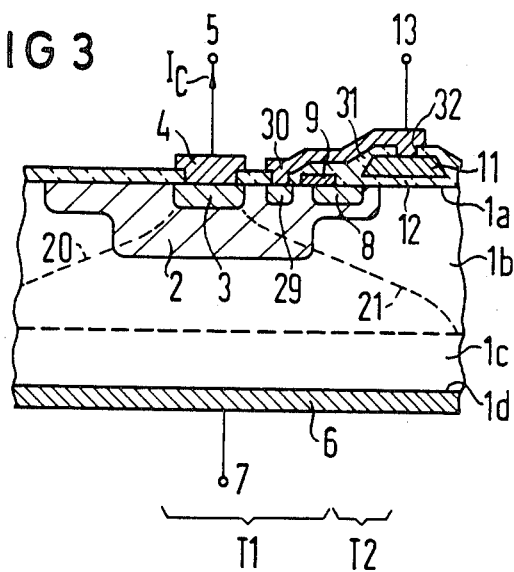
FIGS. 3 and 4 are fragmentary sectional views of Darlington circuits, constructed in accordance with the present invention, and illustrating preferred and advantageous features of the invention.

FIG. 3 illustrates a particularly advantageous feature of the invention in which an $n^+$-doped semiconductor region 29 extends up to the principle surface $1a$ and is located in the island-shaped semiconductor region, for example the region 2, in at least one, but preferably in all transistor combinations, for example the combination T1, T2, being respectively located next to the emitter region, for example the region 3, of the output transistor. Each of these semiconductor regions is provided with a conductive coating 30 which is connected to a terminal to which a negative voltage is applied when the Darlington circuit is shut off. The terminal 13 can be employed for this purpose with particular advantage. In this case, the conductive coating is disposed on an intermediate insulating layer 31 and is extended to such a degree that it contacts the gate electrode 11 connected with the terminal 13 in the region of a window 32 of the layer 31. Together with the island-shaped semiconductor region 2, the region 29 forms a discharge dial which, given connection of the negative voltage to the terminal 13, i.e. given shut off of the collector current $I_C$, is switched transmissive and effects an accelerated dismantling of the storage charges, for example at 20, 21. The storage time $t_s$, which is defined as the time interval after which the collector current likewise begins to decrease given the decrease of the base current, is therefore considerably shortened. In comparison to an external discharge diode employed in a known manner in Darlington circuits, the integrated discharge diode 2, 29, 30 has the significant advantage that only one conductive coating 30 is required for its connection, in contrast whereto an external discharge diode requires two leads and significantly increases the space requirement of the Darlington circuit.

The discharge diode 2, 29, 30 is particularly effective when it is respectively disposed in the individual transistor combinations between the emitter region, for example the emitter region 3, of the output transistor and the source region, for example the region 8, of the appertaining field effect transistor, for example the transistor T2. The storage times $t_s$ becomes all the shorter the higher the number of transistor combinations which are equipped with a discharge diode 2, 29, 30, since all the more transistor combinations are therefore simultaneously freed of their storage charges.

Figure 4:
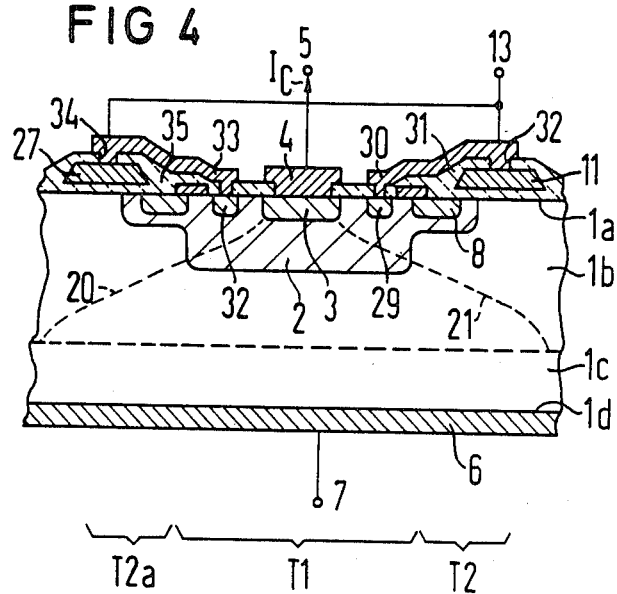

FIG. 4 illustrates the application of the above-described feature to an exemplary embodiment in accordance with FIG. 2. In addition to the discharge diode 2, 29, 30, a further, analogously constructed discharge diode is provided which is composed of an n+-doped semiconductor region 32 which is provided with a conductive coating 33. In the region of the window 34 of an intermediate insulating layer 35, the coating 33 contacts the gate electrode 27 of the field effect transistor T2a. As a result of the disposition of the second discharge diode in an island-shaped semiconductor region, the discharge of the stored charges, for example at 20, 21, is further accelerated given the shut off of the collector current.

The integration of the discharge diodes 2, 29, 30 and, under given conditions, 2, 32, 33 occurs with particular advantage given embodiments of the invention in which the width of the emitter regions, for example the regions 3, of the output transistor is selected significantly smaller than the lateral spacing between two such regions, for example the regions 3 and 14. Thereby the width b can be dimensioned smaller by an order of magnitude than the spacing.

In addition to the heretofore described embodiments of the invention, embodiments are also of interest wherein the described semiconductor regions are respectively replaced by those having the opposite conductivity type, whereby the heretofore cited voltage or, respectively, current are replaced by those having the respectively opposite operational sign.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a Darlington circuit of the type which comprises a field effect transistor and a bipolar output transistor which are integrated in a semiconductor body of a first conductivity type, in which an island-shaped base region of an opposite second conductivity type is located in said body, in which a source region of the first conductivity type is located in the island-shaped semiconductor region, in which an edge zone of the island-shaped semiconductor base region extends up to a first principle surface of the semiconductor body and is carrying an insulated gate electrode, the source region being connected to the base region, in which an emitter region is located in the island-shaped base region and is connected to an emitter terminal, and in which the semiconductor body carries a collector terminal which simultaneously serves as a drain terminal, the improvement comprising:

the emitter region including a plurality of non-contiguous
emitter subregions of the first conductivity type spaced apart at the first principle boundary surface and each connected to the emitter terminal;
a plurality of the island-shaped semiconductor base regions each including a respective emitter subregion therein;
a plurality of the source regions each located in a respective island-shaped semiconductor region;
a plurality of electrically-conductive coating each contacting a respective source region;
a plurality of the edge zones, corresponding to the plurality of source regions, each in a respective island-shaped semiconductor base zone;
a plurality of insulated gate electrodes each carried over a respective edge zone and all connected to a common gate terminal;
a second principle surface on the semiconductor body and carrying the collector terminal; and
the lateral spacing between an emitter subregion and the adjacent source region being less than the thickness of the semiconductor body between the first and second principle surfaces.

2. The improved Darlington circuit of claim 1, wherein:

the semiconductor body comprises a first, weakly doped layer of the first conductivity type, and a second, more highly doped layer of the first conductivity type carrying the first layer and carrying the collector contact.

3. The improved Darlington circuit of claim 1, wherein:

each of said source regions is located between a pair of emitter subregions and in the same island-shaped region as one of said emitter subregions of the pair.

4. The improved Darlington circuit of claim 1, wherein:

two of the source regions are located between two of the emitter subregions and each of said source region is located in the respective island-shaped regions which contain the respective emitter subregions.

5. The improved Darlington circuit of claim 1, wherein:

the width of each emitter subregion, as measured in a direction toward an adjacent emitter subregion, is less than the lateral spacing between the two emitter subregions.

6. The improved Darlington circuit of claim 1, wherein:

the width of each emitter subregion, as measured in a direction toward an adjacent emitter subregion, is less by an order of magnitude than the lateral spacing between the two emitter subregions.

7. The improved Darlington circuit of claim 1, and further comprising:
  at least one semiconductor region of the first conductivity type located in a respective, island-shaped base region and extending up to the first principle boundary surface; and
  a conductive coating contacting said at least one semiconductor region for receiving a shut-off voltage for the Darlington circuit.

8. The improved Darlington circuit of claim 7, wherein:
  the common gate terminal constitutes said conductive coating for receiving the shut-off voltage.

* * * * *